(12) United States Patent
Richardson (10) Patent No.: US 10,763,037 B2
(45) Date of Patent: Sep. 1, 2020

(54) EMI REJECTION FOR NEAR FIELD LINKS (71) Applicant: Analog Devices, Inc., Norwood, MA (US)

(72) Inventor: Kenneth G. Richardson, Erie, CO (US)

(73) Assignee: Analog Devices, Inc., Norwood, MA (US)

( * ) Notice: Subject to any disclaimer, the term of this patent is extended or adjusted under 35 U.S.C. 154(b) by 50 days.

(21) Appl. No.: 16/298,913

(22) Filed: Mar. 11, 2019

(65) Prior Publication Data
US 2019/0295770 A1 Sep. 26, 2019

Related U.S. Application Data (60) Provisional application No. 62/647,464, filed on Mar. 23, 2018.

(51) Int. Cl.
*H01F 27/33* (2006.01)
*H01F 38/14* (2006.01)
(Continued)

(52) U.S. Cl.
CPC ............. *H01F 38/14* (2013.01); *H01F 27/33* (2013.01); *H04B 1/12* (2013.01); *H04B 5/0031* (2013.01);
(Continued)

(58) Field of Classification Search
CPC .... H01F 27/33; H01F 38/14; H01F 2038/143; H04B 1/12; H04B 5/0031; H04B 5/0087; H04B 15/00; H04B 15/005
(Continued)

(56) References Cited

U.S. PATENT DOCUMENTS 3,963,975 A * 6/1976 Gauper, Jr. ............. H01F 27/34
363/15
5,041,791 A 8/1991 Ackerman et al.
(Continued)

FOREIGN PATENT DOCUMENTS

CN 102194090 A 9/2011
KR 101922531 B1 11/2018
(Continued)

OTHER PUBLICATIONS

PCT/US2019/021898, EPO as ISA, "International Search Report and Written Opinion" dated Jul. 1, 2019, 18 pages.
(Continued)

*Primary Examiner* — William Hernandez
(74) *Attorney, Agent, or Firm* — Patent Law Group; Brian D. Ogonowsky (57) ABSTRACT

For near field communications, inductive coils coupled to each communicating circuit are brought close together so that there is inductive coupling between the two coils. Data signals can then be relayed between the two circuits without any direct connection between them. However, the system is susceptible to common mode noise, such as ambient EMI. In addition to the "active" coil pairs used for transmitting and receiving data, a pair of "passive" coils is provided, proximate to the active coil pairs, that is only used for detecting the ambient EMI. The EMI signals detected by the passive coils are processed by a noise detector/processor, and the noise detector processor then controls the transmitters and/or receivers to at least partially compensate for the detected EMI signals. Transmit power or receiver thresholds may be controlled by the noise detector/processor to improve the signal-to-noise ratio, or other compensation techniques can be used.

20 Claims, 4 Drawing Sheets

(51) Int. Cl.
*H04B 15/00* (2006.01)
*H04B 5/00* (2006.01)
*H04B 1/12* (2006.01)

(52) U.S. Cl.
CPC ......... *H04B 5/0087* (2013.01); *H04B 15/005* (2013.01)

(58) Field of Classification Search
USPC ......................................................... 307/104
See application file for complete search history.

(56) References Cited

U.S. PATENT DOCUMENTS

| | | | |
|---|---|---|---|
| 5,198,807 | A | 3/1993 | Troyk et al. |
| 6,208,135 | B1 | 3/2001 | Shattil |
| 6,690,169 | B2 | 2/2004 | Candy |
| 6,870,370 | B2 | 3/2005 | Bryan |
| 6,885,258 | B2 | 4/2005 | Suzuki |
| 8,061,017 | B2 | 11/2011 | Fouquet et al. |
| 8,169,185 | B2 | 5/2012 | Partovi et al. |
| 8,891,733 | B2 | 11/2014 | Liu et al. |
| 9,019,057 | B2 | 4/2015 | Fouquet et al. |
| 9,112,364 | B2 | 8/2015 | Partovi |
| 9,126,514 | B2 | 9/2015 | Soar |
| 9,230,732 | B2 | 1/2016 | Muratov et al. |
| 10,068,704 | B2 | 9/2018 | Jeong |
| 2003/0042571 | A1 | 3/2003 | Chen et al. |
| 2005/0053229 | A1* | 3/2005 | Tsatsanis ............... H04B 3/542 379/406.01 |
| 2011/0291819 | A1 | 12/2011 | Kaeriyama |
| 2014/0134966 | A1* | 5/2014 | Kung ................. H01L 23/49541 455/128 |
| 2015/0365138 | A1 | 12/2015 | Miller et al. |
| 2016/0172894 | A1 | 6/2016 | Kfiripkov et al. |
| 2017/0012677 | A1 | 1/2017 | Subramonian et al. |
| 2018/0040570 | A1 | 2/2018 | Kung et al. |
| 2018/0301790 | A1 | 10/2018 | Kim et al. |
| 2019/0363752 | A1* | 11/2019 | Tarafi ....................... H04B 1/40 |

FOREIGN PATENT DOCUMENTS

| | | |
|---|---|---|
| WO | 1996041203 A1 | 12/1996 |
| WO | 2018155858 A1 | 8/2018 |

OTHER PUBLICATIONS

Throngnumchai et al., "Design and Evaluation of a Wireless Power Transfer System with Road Embedded Transmitter Coils for Dynamic Charging of Electric Vehicles," EV527 International Battery, Hybrid and Fuel Cell Electric Vehicle Symposium, Nov. 17-20, 2013, pp. 1-10, Barcelona, Spain.

Yan et al., "Modeling of Electromagnetic Interference Noise Mechanism for Magneto-Rheological Damper." ICIRA 2012, Part II, LNAI 7507, pp. 153-163, Springer-Verlag Berlin Heidelberg 2012.

Zhang et al., "Design of Compensation Coils for EMI Suppression in Magnetostrictive Linear Position Sensors." Sensors, 2012, pp. 6395-6403, School of Electronic, Information and Electrical Engineering, Shanghai Jiao Tong University, Shanghai, China.

* cited by examiner

EMI REJECTION FOR NEAR FIELD LINKS

CROSS-REFERENCE TO RELATED APPLICATIONS

This application is based on and claims priority from U.S. Provisional Patent Application Ser. No. 62/647,464, filed Mar. 23, 2018, by Kenneth G. Richardson, incorporated herein by reference.

FIELD OF THE INVENTION

This invention relates to circuits that communicate with each other using near field RF, which provides galvanic isolation between circuits, and, in particular, to reducing the effects of common mode noise on the quality of the communications.

BACKGROUND

In some situations it is desirable to electrically isolate two circuits from each other while enabling the circuits to communicate. This may be done for isolating the circuits' grounds from each other, or for reducing the coupling of noise from one circuit to the other, or for any other purpose. Common techniques used for such "galvanic isolation" include using transformers or optical links.

Transformers tend to be relatively large and expensive. Optical links require an LED and a photodetector, which add significant size and cost to the circuits. Optical links are not susceptible to electromagnetic interference (EMI), but the electronics in the photodiode detector circuit are susceptible to EMI. Shielding of connectors may be used to mitigate the effects of ambient EMI, and internal EMI shielding may be added to the package, but such shielding adds cost. Filters to filter out the EMI may be added to the receiver but add signal delay.

What is needed is a more compact and inexpensive technique to galvanically isolate two or more circuits, such as separate dies within an integrated circuit (IC) package, or separate circuits on a printed circuit board (PCB), that communicate with each other, where the communications link is robust in the presence of EMI.

SUMMARY

The present invention involves improvements in near field RF communication techniques between circuits mounted on the same PCB.

For near field communications, inductive coils coupled to each circuit are brought close together so that there is inductive coupling between the two coils. Data signals can then be relayed between the two circuits without any direct connection between them. However, due to the nature of the inductive coupling, the system is susceptible to common mode noise. Such noise may be generated by high frequency switching circuits or by any other source of noise, causing EMI. Such noise, if strong enough, could result in signal corruption and/or data errors.

Techniques are described herein to reduce the susceptibility of the data to errors caused by EMI when using near field communications between circuits.

One technique is to provide the inductive coils very close to one another to improve the magnetic coupling. The induced voltage is proportional to the inverse cube of the transmission distance. This is done by patterning flat spiral coils of a conductive material (e.g., a metal) to form overlapping inductive antennas that are separated by a thin dielectric, such as polyimide. Therefore, there is very good magnetic coupling and good signal-to-noise ratio. The overlapping arrangement of the flat coils results in a small size.

A second technique is to provide an additional near field antenna, identical to the antennas used for the communicating circuits, that is only used to detect the level of EMI. This added "passive" EMI detection circuit is proximate to the "active" circuits that are communicating with each other on the same PCB so that the detected EMI would be the same as that experienced by all the communicating circuits. Once the level of EMI is detected by the EMI detection circuit, the EMI detection circuit may control the receivers of the communicating circuits to set an optimal threshold for determining whether a transmitted digital signal is a one or a zero.

The EMI detection circuit may also control the output power of the transmitters to increase in the presence of a relatively high EMI signal.

The detected EMI signal waveform may also be subtracted from the received data signal waveform to offset any EMI signal in the data path. Similarly, there may be pre-emphasis by subtracting the detected EMI signal from the transmitted data signal.

Accordingly, inexpensive and compact near field RF isolation may be used to isolate communicating circuits with very good noise rejection by using any combination of the above-described techniques. The techniques are applicable to circuits that use differential signals as well as single ended signals.

DETAILED DESCRIPTION

Figure 1:
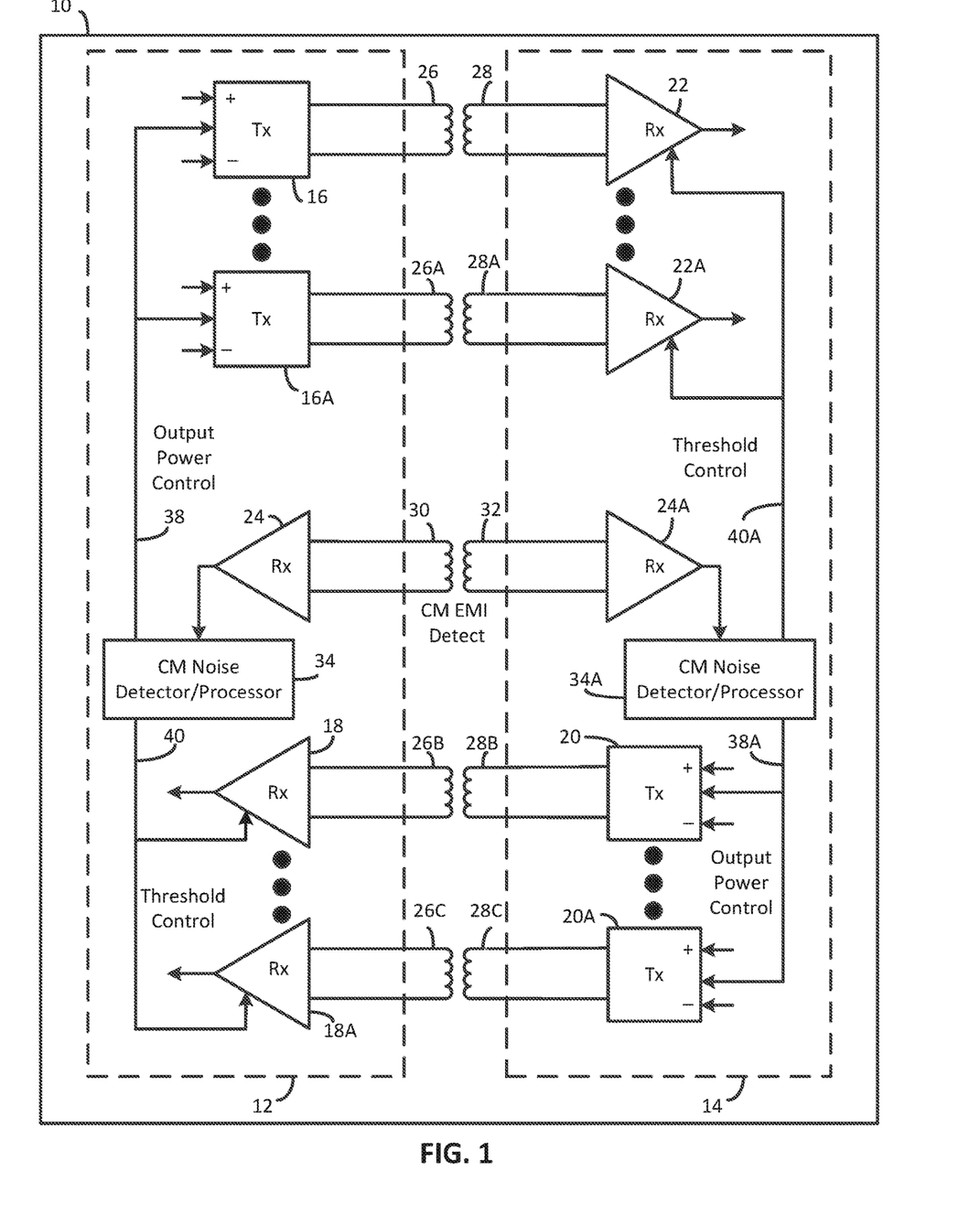
FIG. 1 is a schematic illustration of an IC package containing two dies having "active" circuits that communicate with each other using near field RF communication. Also included in the package is an EMI detection circuit that "passively" detects the EMI experienced by the active circuits and improves the signal-to-noise ratios of the active circuits based on the detected EMI.

FIG. 1 illustrates an IC package 10 containing two dies 12 and 14. The package 10 has terminals for connection to a printed circuit board. The two dies 12 and 14 include any circuitry that needs to communicate between the dies 12 and 14. Digital data is presumed in the embodiments, although analog information may also be communicated.

Only the transmitters and receivers are shown in the dies 12 and 14, for four communication channels, since the other circuitry in the dies that generate the baseband data may be any conventional circuitry for any application. Active transmitters 16 and 16A and active receivers 18 and 18A are in the die 12, and active transmitters 20 and 20A and active receivers 22 and 22A are in the die 14. There may be more or less communication channels. The transmitters and receivers may also be transceivers where the transmit and receive functions use the same antenna. The transmitters may receive baseband data and modulate an RF carrier, such as at about 500 MHz. The modulated signal may be amplified.

Although FIG. 1 shows the dies 12 and 14 within a single package, the dies 12 and 14 may be in separate packages mounted on a printed circuit board.

Also shown is a passive circuit that just receives EMI signals, comprising receivers 24 and 24A.

The four channels communicate by near field RF communications, allowing there to be no direct electronic connection between the two paddles (flat area of the metal lead frame where the die is attached) in the package 10. This enables the grounds associated with the paddles of the dies 12 and 14 to be independent and helps prevent noise generated in one side of a package (such as switching noise) from being coupled to a circuit in the other side of the package. There may be additional ICs in the package 10 that communicate with each other. Other reasons for galvanically isolating circuits exist.

Each transmitter is connected to a substantially identical inductive coil 26, 26A, 28B, and 28C, and each receiver is connected to a substantially identical inductive coil 28, 28A, 26B, and 26C. The receive and transmit coil pairs are very close to one another and are fabricated on the same substrate for good magnetic coupling. Such coils are described in detail later with respect to FIGS. 6 and 7. In one embodiment, the two coils in a coil pair are flat metal spirals that overlap and are separated by a thin dielectric.

All the coils are within the package 10 and are connected to the dies 12 and 14 by bond wires or metal traces. If the dies 12 and 14 are in separate packages, the coils may be external modules mounted on a printed circuit board.

Each die 12 and 14 has output pads coupled to the ends of the respective coils for either providing a current through a coil for transmitting a modulated data signal, or for receiving a voltage induced in the associated coil in the pair for receiving the modulated data signal. In one embodiment, the carrier is at 13.56 MHz. The carrier frequency may be much higher, and any type of modulation may be used (e.g., AM, FM, etc.).

One problem with near field communications is that it is sensitive to EMI. Ambient EMI may be received by any of the coils, and the EMI waveform combines with the data waveforms. If the EMI is strong enough, the data signals will be corrupted, producing errors. Although shielding the packages and coils may reduce the EMI received by the coils, such shielding is expensive and adds bulk.

The system of FIG. 1 includes a passive circuit that only receives EMI signals using coils 30 and 32 that are substantially identical to the transmit and receive coils of the active circuits, such as the coils 26 and 28. Therefore, since the passive coils 30 and 32 are proximate to all the other circuitry in the same package and are the same design, the EMI signals received by the passive coils 30 and 32 should be about the same as the EMI signals received by all the active coils.

All coils should be terminated in the same way for matching impedances for maximizing efficiency, such as by a conventional capacitor/resistor network connected to the package's ground.

As the system is operating to generate and communicate modulated data between the dies 12 and 14, the passive EMI detection circuit, comprising the passive coils 30 and 32 and the receivers 24 and 24A, receives the same EMI signals received by all the other coils. The received EMI signals are processed by an associated common mode (CM) noise detector/processor 34 and 34A. The detector/processor 34 and 34A may determine the RMS power of the EMI signals, or measure the peak amplitude of the EMI signals, or determine other characteristics of the received EMI signals. The particular detection and processing of EMI signals depend on how the designer wants to compensate the receivers and/or transmitters for the detected EMI. Such a circuit design is well within the skills of one skilled in the art. The detector/processor 34 and 34A then applies the EMI waveform and/or the detected EMI characteristics to the various active transmitters and active receivers to mitigate the effects of the EMI signal on the data communications.

In one example shown in FIG. 1, the detector/processor 34 and 34A generates an output power control signal on lines 38 and 38A to optimally control the output power of the active transmitters 16, 16A, 20, and 20A. This may just control the power amplifier that outputs the modulated data signals. The magnitude of the input signal into the power amplifier may also be controlled. When the detected EMI signal is relatively high, the power control signal increases the output power of the transmitters to improve the signal-to-noise ratio.

An additional technique is to raise or lower the thresholds of the active receivers, where the threshold determines whether a received demodulated signal is a logical one or a zero. In the presence of strong common mode noise, the thresholds would be raised to prevent the receiver from indicating that a noise spike is data. This control of the threshold is shown by the detector/processor 34 and 34A outputting a threshold control signal on the lines 40 and 40A.

Figure 2:
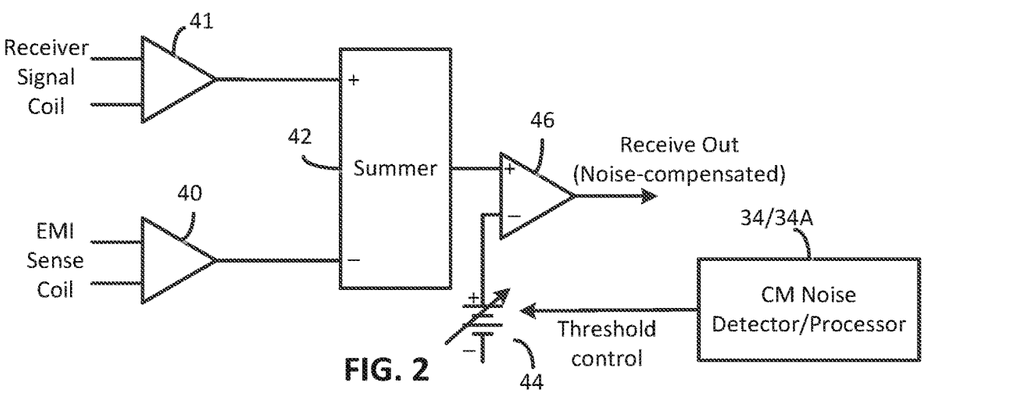
FIG. 2 illustrates a portion of a receiver and how the detected common mode EMI signals can be used to offset the EMI component of the data signals, and also used to control the threshold of the receiver.

FIG. 2 illustrates another technique where the detected EMI waveform on the coil 30 or 32 is used to offset the EMI component of a received signal on one of the active receiver coils 26B, 26C, 28, and 28A. This maintains phase coherency between the EMI waveform and the data signals. FIG. 2 illustrates a portion of any of the active receivers. The EMI signal across the EMI sense coil 30 or 32 is applied to an amplifier or buffer 40, and the combined data and EMI signal from the active receiver coil (e.g., coil 28) is applied to an identical amplifier or buffer 41. The amplified signals are applied to inputs of a summer 42 for subtracting the EMI waveform from the combined data/EMI waveform to cancel out the EMI component of the data/EMI waveform. The output of the summer 42 then is approximately only the data signal without noise. To reduce the effects of EMI even further, the CM noise detector/processor 34 or 34A can adjust the voltage threshold 44 of the receiver. The adjusted threshold is applied to one input of a comparator 46 for comparison to the data signal (assuming amplitude modulation is used) to determine whether the signal is a logical one or zero. A higher strength EMI signal would cause the threshold to be raised to avoid false triggering of the comparator 46. The digital output of the comparator 46 is thus compensated for the common mode EMI.

Although the circuit of FIG. 2 is for single-ended data, the circuit can be easily modified for differential data by applying the compensation to the positive and negative data channels.

Figure 3:
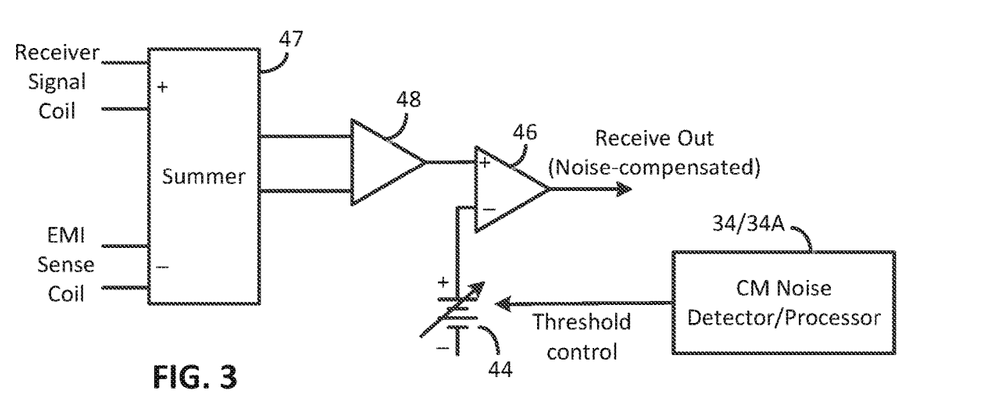
FIG. 3 illustrates a receiver portion similar to that of FIG. 2 but the signals at both ends of the EMI sense coil and the active receiver coil are subtracted to maintain phase coherence.

FIG. 3 illustrates a receiver portion similar to FIG. 2 but the signals at both ends of the EMI sense coil and the active receiver coil are subtracted to maintain phase coherence. The four input signals into the summer 47 may be amplified or buffered as needed. Buffering may be used to reduce loading on the coils. The output of the summer 47 is differential and applied to an amplifier 48. The output of the amplifier 48 is applied to the input of the comparator 46, as discussed with respect to FIG. 2.

Figure 4:
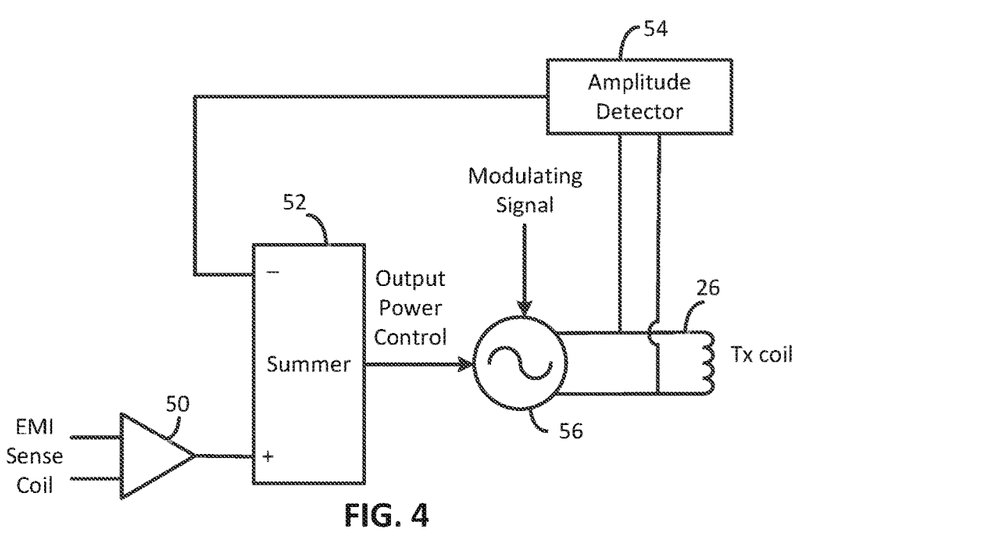
FIG. 4 illustrates a portion of a transmitter and how the detected common mode EMI signals can be used to offset the EMI component of the data signals, and also used to control the output power of the transmitter.

FIG. 4 illustrates a portion of each transmitter 16, 16A, 20, and 20A, where the sensed EMI signal is applied to the input of an amplifier or buffer 50. The output of the amplifier or buffer 50 is applied to one input of a summer 52. A signal proportional to the modulated transmit signal applied to the transmit coil (e.g., coil 26 in FIG. 1) is generated by an amplitude detector 54 and applied to the other input of the summer 52. Amplitude detector 54 and amplifier or buffer 50 apply signals to the summer 52 that are proportional to the respective powers of the two signals. The magnitude of the output of the summer 52 therefore reflects the relative power levels of the EMI signal and transmitter output signal. If the EMI signal is relatively high, the output of the summer 52 controls the modulator or power amplifier 56 to increase the output power of the transmitter to improve the signal-to-noise ratio of the transmitted signal.

In another embodiment, the detected EMI waveform may be subtracted from the baseband data signal for pre-emphasis of the transmitted signal to offset the EMI component coupled to the transmit coil 26.

Improvements of 10-20 dB in signal-to-noise ratio can be achieved using the techniques described herein. The performance improvement somewhat depends on the wavelengths of the EMI signal, where shorter wavelengths may affect the receivers and transmitters in differing amounts if the distance from the signal coil (e.g., coil 28 in FIG. 1) that is furthest from the EMI detection coil 30/32 is greater than about lambda/20 from the EMI detection coil 30/32, where lambda is the wavelength of the shortest significant component of EMI signal in the environment of the system.

Figure 5:
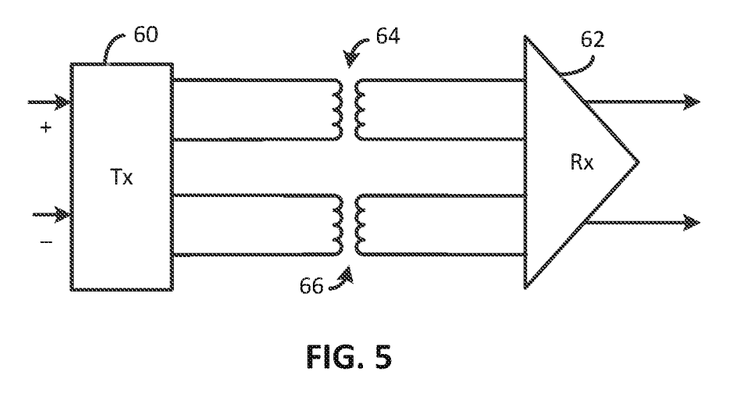
FIG. 5 illustrates a differential data system for one of the active circuits, where the EMI detection circuit uses the same near field antenna structure to detect the EMI experienced by the active circuits and improve the signal-to-noise ratios of the active circuits based on the detected EMI.

FIG. 5 illustrates a differential transmitter 60 and receiver 62 using two pairs of coils 64 and 66 for near field communication of the differential data signals. The same EMI compensation techniques discussed above may be applied to the differential system.

Figure 6:
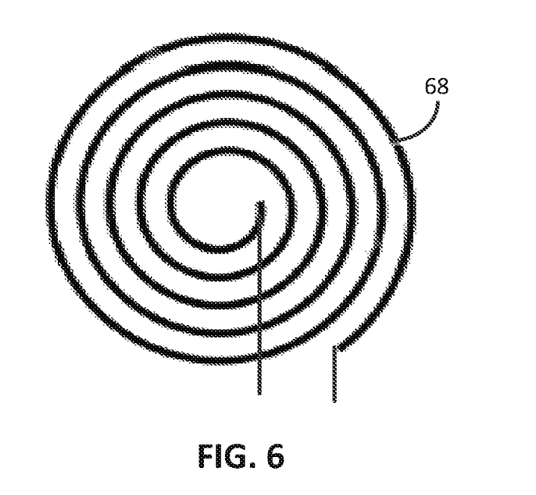
FIG. 6 illustrates a flat spiral coil used as a near field inductive antenna in the embodiments.

FIG. 6 is a top down view of one of the coils 68 (e.g., a transmitter coil). All coils should be substantially identical to the EMI detection coils 30/32. In one embodiment, a thin layer of copper is laminated on a thin (e.g., 20 micron) polyimide sheet 69 (FIG. 7) and etched to form a flat spiral coil with the appropriate number of turns.

Figure 7:
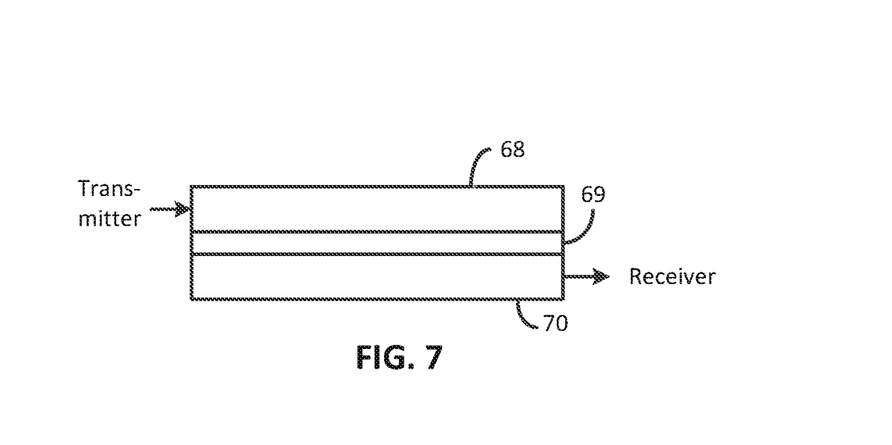
FIG. 7 is a cross-sectional view of the near field antenna system used for all circuits, where a pair of identical coils overlap and are separated by a thin dielectric.

As shown in FIG. 7, a substantially identical coil 70 (a receiver coil) is laminated to the transmitter coil 68 or simply formed on the opposite side of the polyimide sheet. The width of the coils may be less than one millimeter. As such, the two coils are very close together for excellent magnetic coupling for high signal-to-noise ratio, and the structure is very flat, reproducible, and inexpensive. The coil pair of FIG. 7 may be a separate die with leads for connection to the dies 12 and 14 within the package 10, or the coil pair of FIG. 7 may be formed directly on one or both of the dies 12 and 14.

The transmit and receive coils may have different "turns". The EMI detection coils 30/32 should have the same top and bottom coils as the transmit and receive coils to detect the same EMI as the transmit and receive coils.

Various other circuit designs may be used to implement the invention.

Figure 8:
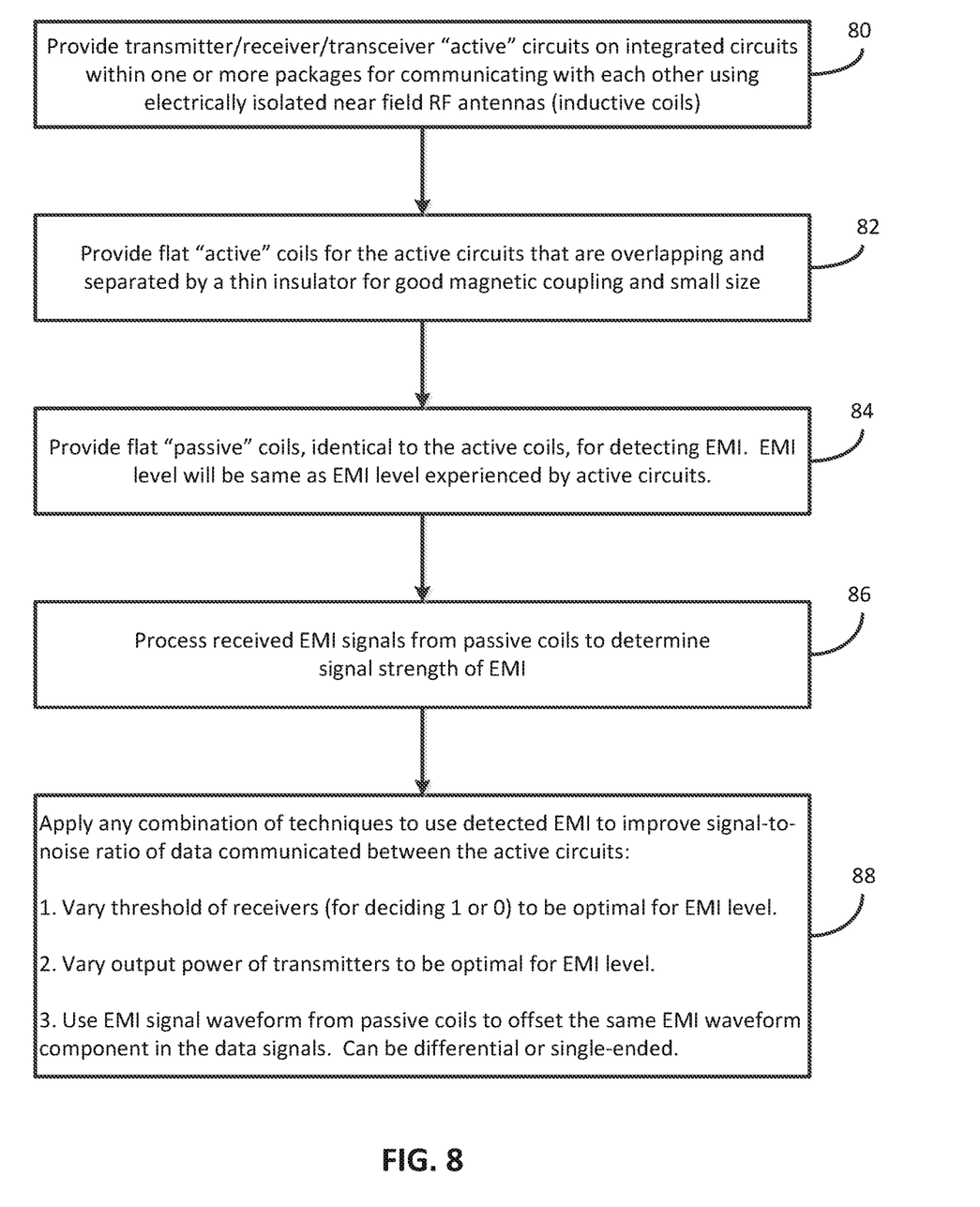
FIG. 8 is a flowchart summarizing the techniques used for improving the signal-to-noise ratio of the data signals based on the detected EMI.

FIG. 8 is a flowchart summarizing the descriptions above. In step 80, the active circuits are provided in one or more IC packages and communicate with each other using near field RF.

In step 82, the active coils are provided that overlap for good magnetic coupling and good signal-to-noise ratio, In step 84, passive coils (preferably substantially identical to the active coils) are provided that receive the same EMI signals received by the active coils.

In step 86, the EMI signals detected by the passive coils are processed to determine the strength of the EMI signals.

In step 88, based on the detected EMI signals from the passive circuit, the receive and transmitted signals may be compensated for EMI by any combination of techniques. These techniques include: 1) varying the thresholds of the receivers; 2) varying the output power of the transmitters; and 3) subtracting the EMI waveform from the received data or the data to be transmitted.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A system comprising:
    a first circuit for transmitting data;
    a second circuit for receiving the transmitted data;
    a first electromagnetic interference (EMI) detection circuit;
    a first inductive coil coupled to the first circuit for transmitting the data using near field communications;
    a second inductive coil coupled to the second circuit for receiving the data using near field communications, the second inductive coil being proximate to the first inductive coil for magnetic coupling between the second inductive coil and the first inductive coil; and
    a third inductive coil coupled to the first EMI detection circuit for detecting EMI signals that are also substantially received by the first inductive coil or the second inductive coil,
    wherein the first EMI detection circuit is configured to control at least one of the first circuit or the second circuit to improve a signal-to-noise ratio of a data signal based on the EMI signals detected by the third inductive coil.

2. The system of claim 1 wherein the first inductive coil comprises a flat first spiral and the second inductive coil comprises a flat second spiral, wherein the first spiral and the second spiral overlap and are separated by a dielectric layer.

3. The system of claim 1 further comprising:
a fourth inductive coil, the third inductive coil being proximate to the fourth inductive coil for magnetic coupling between the third inductive coil and the fourth inductive coil; and
a second EMI detection circuit coupled to the fourth inductive coil, wherein the second EMI detection circuit is configured to control at least one of the first circuit or the second circuit to improve the signal-to-noise ratio of the data signal based on EMI signals detected by the fourth inductive coil.

4. The system of claim 3 wherein physical and electrical properties of the first inductive coil and the second inductive coil, when proximate to each other, are substantially identical to the physical and electrical properties of the third inductive coil and the fourth inductive coil when proximate to each other.

5. The system of claim 4 wherein the first inductive coil and the second inductive coil are both in a first die within a package, and the third inductive coil and the fourth inductive coil are both in a second die within the package.

6. The system of claim 3 wherein the first EMI detection circuit is located on a first die along with the first circuit, and the second EMI detection circuit is located on a second die along with the second circuit.

7. The system of claim 1 wherein the first circuit comprises a transmitter, and the first EMI detection circuit controls an output power of the transmitter based on detected EMI signals.

8. The system of claim 1 wherein the second circuit comprises a receiver, and the first EMI detection circuit controls a threshold of the receiver for determining a binary level of the transmitted data.

9. The system of claim 1 wherein the first circuit comprises a transmitter, and the first EMI detection circuit compensates a data signal to be transmitted by the transmitter based on detected EMI signals.

10. The system of claim 1 wherein the second circuit comprises a receiver, and the first EMI detection circuit compensates a received data signal based on detected EMI signals.

11. The system of claim 1 wherein the second circuit comprises a summer for receiving signals from the second inductive coil and receiving signals obtained from the third inductive coil, where an output of the summer is a difference between the signals from the second inductive coil and the signals obtained from the third inductive coil, wherein the output of the summer comprises a data signal that has been at least partially compensated for the EMI signals.

12. The system of claim 1 wherein the first circuit comprises a summer for receiving signals to be transmitted and receiving signals obtained from the third inductive coil, where an output of the summer is a difference between the signals to be transmitted and the signals obtained from the third inductive coil, wherein the output of the summer comprises an output power control signal for the first circuit.

13. The system of claim 1 wherein the first circuit transmits single-ended data signals, and the second circuit receives the single-ended data signals.

14. The system of claim 1 wherein the first circuit transmits differential data signals, and the second circuit receives the differential data signals.

15. The system of claim 14 further comprising:
a fourth inductive coil coupled to the first circuit for transmitting, in conjunction with the first inductive coil, the differential data signals using near field communications; and a fifth inductive coil coupled to the second circuit for receiving, in conjunction with the second inductive coil, the differential data signals using near field communications, the fourth inductive coil being proximate to the fifth inductive coil for magnetic coupling between the fourth inductive coil and the fifth inductive coil.

16. A method performed by a system comprising:
transmitting data by a first circuit;
receiving the transmitted data by a second circuit;
detecting electromagnetic interference (EMI) by a first EMI detection circuit;
transmitting the data using near field communications via a first inductive coil coupled to the first circuit;
receiving the data using near field communications via a second inductive coil coupled to the second circuit, the second inductive coil being proximate to the first inductive coil for magnetic coupling between the second inductive coil and the first inductive coil; and
detecting EMI signals by a third inductive coil coupled to the first EMI detection circuit, wherein the EMI signals are also substantially received by the first inductive coil or the second inductive coil,
controlling, by the first EMI detection circuit, at least one of the first circuit or the second circuit to improve a signal-to-noise ratio of a data signal based on the EMI signals detected by the third inductive coil.

17. The method of claim 16 further comprising:
detecting the EMI signals by a fourth inductive coil coupled to a second EMI detection circuit, wherein the third inductive coil is proximate to the fourth inductive coil for magnetic coupling between the third inductive coil and the fourth inductive coil; and
controlling, by the second EMI detection circuit, at least one of the first circuit or the second circuit to improve the signal-to-noise ratio of the data signal based on EMI signals detected by the fourth inductive coil.

18. The method of claim 17 wherein the first EMI detection circuit is located in a first die along with the first circuit, and the second EMI detection circuit is located in a second die along with the second circuit.

19. The method of claim 17 wherein physical and electrical properties of the first inductive coil and the second inductive coil, when proximate to each other, are substantially identical to the physical and electrical properties of the third inductive coil and the fourth inductive coil when proximate to each other.

20. A system comprising:
a first means for transmitting data;
a second means for receiving the transmitted data;
a third means for detecting electromagnetic interference (EMI);
a first inductive coil coupled to the first means for transmitting the data using near field communications;
a second inductive coil coupled to the second means for receiving the data using near field communications, the second inductive coil being proximate to the first inductive coil for magnetic coupling between the second inductive coil and the first inductive coil; and a third inductive coil coupled to the third means for detecting EMI signals that are also substantially received by the first inductive coil or the second inductive coil, wherein the third means is configured to control at least one of the first means or the second means to improve a signal-to-noise ratio of a data signal based on the EMI signals detected by the third inductive coil.

\* \* \* \* \*